United States Patent Office 3,342,631

Patented Sept. 19, 1967

3,342,631

METHOD OF FORMING SUPERCONDUCTIVE METAL LAYERS ON ELECTRICALLY NON-CONDUCTIVE SUPPORTS

Cornelis van de Stolpe and Jean Francois Marchand, Emmasingel, Eindhoven, Netherlands, assignors to North American Philips Company, Inc., New York, N.Y., a corporation of Delaware No Drawing. Filed Dec. 4, 1963, Ser. No. 330,514

Claims priority, application Netherlands, Dec. 21, 1962, 287,163

3 Claims. (Cl. 117—217)

ABSTRACT OF THE DISCLOSURE

Form superconductive layer of lead or tin on a support by first applying copper layer and then replacing all or part of copper with tin or lead from alkali solution containing tin or lead ions.

The invention relates to a method of forming a superconductive metal layer.

The term "metal layers" is used herein to denote not only uniform layers, but also layers in the form of patterns comprising portions which may be interconnected or discrete.

Such superconductive metal layers are used in cryotrons, the term "cryotrons" being understood to mean herein circuit elements comprising a current conductor of a superconductive metal and means, for example, a second current conductor, of applying a magnetic field to the first-mentioned current conductor in order to cause this first-mentioned current conductor to pass from the superconductive state to the normal conductivity state or conversely. In a cryotron arrangement, the cryotron is surrounded by an environment having so low a temperature, for example, a temperature in the range of from 1° K. to 20° K., that the superconductive state of the cryotron is obtainable.

For satisfactory operation of a cryotron arrangement, the amplification factor or "grain" $g$ is highly significant. This parameter is defined as the ratio between the critical current $i_c$ and the critical control current $i_g$. It must be as great as possible and at least equal to 1 (Solid State Electronics 1, 261–272 (1960)).

In order to obtain a high value of $g$, the range of the magnetic field strength ΔH, in which the ratio between the resistance values in the region, in which the material is caused to pass from the superconductive state to the normally conductive state, varies from 10% to 90% of the resistance value in the normally conductive state, at a temperature which is 0.01° K. lower than that at which the said ratio, without the use of a magnetic field, is 10%, must not exceed 2 Gauss. Another important quantity is ΔT, that is to say, the temperature range in which the said resistance value changes from 10% to 90%, and this ΔT must not exceed 0.01° K.

For practical uses, the thickness of the layer of superconductive metal should be as small as possible, for example, of the order of magnitude of 1$\mu$. This maximum thickness is related to the switching speed; a high switching speed requires a high resistance of the layer. The thicker the layers, the lower the switching speed, and a low speed is undesirable for this use.

With respect to purity, the requirements to be satisfied by such a superconductive layer are very stringent. Impurities, which frequently are in the gaseous state, such as oxygen, can only be permitted to an amount of at most 0.01 atomic %.

Hence, for these uses, the superconductive layers have always been formed with the aid of deposition from the vapour state in a vacuum, which has to be an extremely high vacuum of $10^{-5}$ mms. of Hg or less. The deposition of the superconductive layer, especially a layer consisting of Sn or Pb, in an extremely fine pattern, as is necessary for cryotrons, with the aid of a mask by means of such deposition from the vapour state is not very attractive.

Recently, however, a method was made known by which a superconductive layer of tin is formed on a support with the aid of electro-deposition. By this method, ΔT-values of about 0.01° K. are reached. The tin-plating bath used has an acid reaction and contains saccharine, a complex former and a surface-active compound.

In this manner, however, tin layers of uniform thickness cannot be made, and this is a particular disadvantage in manufacturing superconductive patterns of small size, as used for cryotron arrangements, for this lack of uniformity renders it impossible to obtain cryotrons having reproducible properties.

According to the present invention, however, superconductive layers having reproducible properties can be produced so as to have a ΔT value of between about 0.005 and 0.01° K. Furthermore, superconductive layers of lead may be formed in a similar manner.

The method according to the invention consists in that a metal layer is formed according to the desired pattern on a non-conductive support and subsequently, entirely or in part, exchanged electro-chemically for lead or tin with the aid of a solution of lead or tin ions of which the normal potential is less negative than that of the first metal with respect to the same solution.

For this purpose, a copper layer is preferably formed on the support, the copper being subsequently exchanged, entirely or partially, for lead or tin by contact with an alkaline solution of plumbate or stannate ions containing cyanide. This exchange is performed without an external source of current.

In contrast with the known method of producing superconductive layers, the layers made by the method according to the invention have a completely uniform thickness. In addition, the method according to the invention is much simpler. If several electrically insulated patterns are to be made, no special steps need be taken to interconnect these patterns electrically prior to the formation of the superconductive layer.

For the method according to the invention, the most suitable base is a thin electrically conductive pattern of noble metal formed photographically on a non-metallic electrically nonconductive support.

According to a known method, in which a hydrophilic or at least superficially hydrophilized support is used, this support is impregnated in a solution of a photosensitive compound, the light-reaction product of which, in the presence of moisture, is capable of liberating metal from a water-soluble mercury or silver compound, the resulting photosensitized support is subjected, behind a negative, to an exposure with the use of a comparatively high energy, after which the exposed support is brought into contact with a germ introduction bath which consists of a solution of at least one of the said mercury or silver compounds and finally it is subjected to physical development so that an electrically conductive noble-metal pattern is produced. The said exposure is an exposure with an intensity such depending upon the concentration of the metal in the germ introduction bath and the physical development, that an external metal pattern is produced having an electric resistance of at most $10^4$ ohms per square surface. With the the aid of an after-treatment, the resistance of the external metal pattern may generally be reduced to at most 100 ohms per square surface. This may be effected, for example, by heating the layer to a temperature of 100° C.

The resulting noble-metal pattern may then be coated, for example, with a layer of copper either by electrodeposition or with the aid of an electroless copper-plating bath containing a copper salt and a reducing agent for this salt.

In this manner, the noble-metal image can either be directly obtained in the form of the pattern of the cryotron element by exposure behind a negative, or a uniform noble-metal layer may be produced in known manner and covered, with the exception of the desired pattern, by a photo-hardening lacquer, after which the method in accordance with the invention is carried out.

The invention will now be further illustrated by the following examples.

EXAMPLE 1

A cellulose triacetate foil saponified to a depth of 6 microns was impregnated in a solution containing 0.15 mole of o-methoxybenzene diazosulphonic acid Na and 0.1 mole of cadmium lactate, subsequently exposed behind a negative of a pattern of a cryotron arrangement to the light of a 125 watt high-pressure mercury-vapour lamp at a distance of 30 cms. and then immersed in an aqueous solution containing 0.05 mole of mercurous nitrate, 0.03 mole of silver nitrate and 0.1 mole of nitric acid. The foil was then rinsed in water and subsequently developed physically for 15 minutes in an aqueous solution of the following composition:

0.1 molar p-methylaminophenol sulphate,
0.05 molar silver nitrate,
0.1 molar citric acid,
0.02% by weight of "Armac 12 D" (an emulsifier containing the following acetic acid salts of the n-alkyl amines [$C_{12}H_{25}$—$NH_2$] $CH_3COOH$—90% [$C_{14}H_{29}$—$NH_2$] $CH_3COOH$—9% and [$C_{18}H_{37}$—$NH_2$] ($CH_3COOH$—1%) and
0.02% by weight of "Lissapol N," a nonyl phenol ethylene oxide condensate of the formula $$R—(O—CH_2—CH_2)_n—OH$$

wherein R is the nonyl phenol radical and *n* is a large number.

The foil was then rinsed in distilled water, subsequently in a 1 N aqueous solution of sulphuric acid, the resulting silver pattern being coated with copper by electrodeposition for 1 minute in an electrolyte containing 0.75 molar $CuSO_4$ and 0.75 molar $H_2SO_4$ with a current density of 5 amperes per square decimetre. The copper layer had a thickness of $1\mu$.

The assembly was then immersed for 2 minutes in an aqueous solution heated to a temperature of 75° C. and containing per 100 mls. of water:

| | | |
|---|---|---|
| $SnCl_2.2H_2O$ | mgs | 380 |
| NaOH | mgs | 560 |
| KCN | gms | 9.16 |

The resulting tin layer had a thickness of $0.5\mu$ and the above defined $\Delta T$ had a value between 0.005° K. and 0.01° K.

EXAMPLE 2

In a manner identical with that described in Example 1, a copper pattern having a thickness of 2 microns was formed on a similar support. The foil was then immersed for 2 minutes in a solution heated to 75° C. which contained per 1,100 mls. of water:

| | Gms. |
|---|---|
| $Pb(NO_3)_2$ | 4 |
| NaOH | 50 |
| KCN | 20 |

The resulting layer of lead had a thickness of 1 micron and its $\Delta T$ value varied between 0.005° K. and 0.01° K.

What is claimed is:

1. The method of forming a superconductive metal layer on an electrically non-conductive support comprising the steps, forming a copper layer on said support and then treating at least part of said copper layer with an alkaline solution containing cyanide ions and a metal ion selected from the group consisting of plumbate and stannate ions to thereby replace at least part of the copper layer with a metal layer selected from the group consisting of lead and tin.

2. The method of claim 1 wherein a tin layer is formed and the alkaline solution is an aqueous solution of $SnCl_2$, NaOH and KCN.

3. The method of claim 1 wherein a lead layer is formed and the alkaline solution is an aqueous solution of $Pb(NO_3)_2$, NaOH and KCN.

References Cited

UNITED STATES PATENTS 3,072,499 1/1963 Cole et al. ---------- 117—130

ALFRED L. LEAVITT, *Primary Examiner.*

WILLIAM L. JARVIS, *Examiner.*